US010320401B2

(12) United States Patent
Ximenes et al.

(10) Patent No.: US 10,320,401 B2
(45) Date of Patent: Jun. 11, 2019

(54) DUAL-PATH DIGITAL-TO-TIME CONVERTER

(71) Applicant: Xilinx, Inc., San Jose, CA (US)

(72) Inventors: Augusto R. Ximenes, Delft (NE); Bob W. Verbruggen, Saggart (IE); Christophe Erdmann, Dublin (IE)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/784,022

(22) Filed: Oct. 13, 2017

(65) Prior Publication Data

US 2019/0115926 A1  Apr. 18, 2019

(51) Int. Cl.
*H03L 7/091* (2006.01)
*H03L 7/099* (2006.01)

(52) U.S. Cl.
CPC ............ *H03L 7/091* (2013.01); *H03L 7/0992* (2013.01); *H03L 7/0994* (2013.01)

(58) Field of Classification Search
USPC .................................. 327/147–149, 156–159
See application file for complete search history.

(56) References Cited

U.S. PATENT DOCUMENTS

| 6,356,158 | B1 | 3/2002 | Lesea |
| 6,373,301 | B1* | 4/2002 | Chen ................. H03L 7/0805 327/141 |
| 6,466,070 | B1 | 10/2002 | Ross |
| 6,531,913 | B1 | 3/2003 | Ross |
| 6,538,499 | B1 | 3/2003 | Lu |
| 6,542,040 | B1 | 4/2003 | Lesea |
| 6,683,502 | B1 | 1/2004 | Groen et al. |
| 6,975,695 | B1 | 12/2005 | Kuhn |
| 7,092,689 | B1 | 8/2006 | Boecker et al. |
| 7,109,809 | B1 | 9/2006 | Groen et al. |
| 7,133,648 | B1 | 11/2006 | Robinson et al. |
| 7,148,758 | B1 | 12/2006 | Ross et al. |
| 7,224,951 | B1 | 5/2007 | Chuang et al. |
| 7,224,952 | B2 | 5/2007 | Boecker et al. |
| 7,271,634 | B1* | 9/2007 | Daga ................. H03L 7/0812 327/149 |
| 7,279,987 | B1 | 10/2007 | Kaszynski |
| 7,312,645 | B1 | 12/2007 | Brunn |
| 7,336,755 | B1 | 2/2008 | Tetzlaff |
| 7,493,095 | B2 | 2/2009 | Chuang et al. |
| 7,499,513 | B1 | 3/2009 | Tetzlaff et al. |
| 7,504,891 | B1 | 3/2009 | Liu |
| 7,764,129 | B1 | 7/2010 | Wong et al. |

(Continued)

OTHER PUBLICATIONS

Staszewski, R. B., et at, "All-digital TX frequency synthesizer and discrete-time receiver for Bluetooth radio in 130-nm CMOS", IEEE Journal of Solid-State Circuits, vol. 39, No. 12, pp. 2278-2291, Dec. 2004.

(Continued)

*Primary Examiner* — Adam D Houston
(74) *Attorney, Agent, or Firm* — Robert M. Brush

(57) ABSTRACT

An example digital-to-time converter (DTC) includes: a delay chain circuit having a plurality of delay cells coupled in sequence, the delay chain circuit including a first input to receive a first clock signal and a second input to receive a second clock signal; and a DEM controller coupled to the delay chain circuit to provide a plurality of control signals to the plurality of delay cells, respectively.

18 Claims, 9 Drawing Sheets

(56) References Cited

U.S. PATENT DOCUMENTS

| | | | |
|---|---|---|---|
| 7,830,986 B1 | 11/2010 | Gaither | |
| 8,090,335 B1 | 1/2012 | Bataineh | |
| 8,120,430 B1 | 2/2012 | Vasudevan | |
| 8,391,343 B1 | 3/2013 | Chuang et al. | |
| 8,841,948 B1 | 9/2014 | Chien et al. | |
| 9,143,316 B1 | 9/2015 | Novellini | |
| 9,209,958 B1* | 12/2015 | Palaskas | H04B 17/21 |
| 9,306,730 B1 | 4/2016 | Shu et al. | |
| 9,520,890 B1* | 12/2016 | Ben-Bassat | H03M 1/1014 |
| 9,698,807 B1* | 7/2017 | Caffee | H03M 1/1057 |
| 9,791,834 B1* | 10/2017 | Nassar | G04G 5/00 |
| 10,050,634 B1* | 8/2018 | Zhao | H03K 5/135 |
| 2002/0008551 A1 | 1/2002 | Sevalia et al. | |
| 2008/0122544 A1* | 5/2008 | Wang | H03L 7/0891 331/17 |
| 2008/0204092 A1* | 8/2008 | Moehlmann | H03L 7/093 327/156 |
| 2008/0205551 A1 | 8/2008 | Lo et al. | |
| 2009/0244375 A1* | 10/2009 | Moehlmann | H03L 7/087 348/512 |
| 2011/0156783 A1* | 6/2011 | Pavlovic | H03L 7/081 327/159 |
| 2016/0056827 A1* | 2/2016 | Vlachogiannakis | H03B 5/1265 327/158 |
| 2016/0182067 A1* | 6/2016 | Liu | H03L 7/091 327/158 |
| 2017/0063387 A1* | 3/2017 | Gao | H03B 5/1228 |
| 2017/0085365 A1* | 3/2017 | Ravi | H04L 7/042 |
| 2017/0346493 A1* | 11/2017 | Markulic | H03K 5/159 |
| 2018/0375523 A1* | 12/2018 | Yu | H03L 7/095 |

OTHER PUBLICATIONS

Zanuso, M.et.at., "A Wideband 3.6 GHz Digital $\Delta\Sigma$ Fractional-N PLL With Phase Interpolation Divider and Digital Spur Cancellation", IEEE Journal of Solid-State Circuits, pp. 627-636, vol. 46, No. 3, Mar. 2011.

Chen, Zuow-Zun, et al, "A Multiphase Compensation Method with Dynamic Element Matching Technique in Sigma-Delta Fractional-N Frequency Synthesizers", JSTS: Journal of Semiconductor Technology and Science, vol. 8, No. 3, pp. 179-192, Sep. 2008.

\* cited by examiner

DUAL-PATH DIGITAL-TO-TIME CONVERTER

TECHNICAL FIELD

Examples of the present disclosure generally relate to electronic circuits and, in particular, to a dual-path digital-to-time converter (DTC).

BACKGROUND

Digital phase-locked loops (DPLLs) are becoming attractive as replacements for analog PLLs in frequency synthesizers due to their technology portability, loop bandwidth configurability, and overall silicon area consumption. Moreover, among frequency synthesizers, those capable of fractional-N multiplication are preferred due to relaxed system level planning, such as input reference frequency and synthesized output frequency. However, several issues regarding quantization noise and non-linearity, which leads to spurious generation, limit the use of DPLLs in various applications.

On issue with fractional operation is when near-integer channels are desired, where unfiltered spurious tones can fall within the PLL loop bandwidth. The source of the more significant spurious tones is in the phase detector. Historically, in a DPLL, the fractional phase detector is implemented by a time-to-digital converter (TDC) that is capable of quantizing the phase difference between the input and output signals by inverter elements (delay). The limited resolution and non-linearity of the inverter elements in the TDC can produce prohibiting spurious tones.

Recently, the resolution of the phase detection has been improved by the use of a digital-to-time converter (DTC) that delays one of the signals (either input or output frequency) with much more accuracy. However, a conventional DTC is applied to only one of the signals, requiring the use of very complex calibration logic with potential large area and power consumption to avoid spurious tone generation. Even then, noise on the power supply and dynamic mismatches cannot be calibrated easily and very often the phase measurement results are worse than simulated.

SUMMARY

In an example, a digital-to-time converter (DTC) includes: a delay chain circuit having a plurality of delay cells coupled in sequence, the delay chain circuit including a first input to receive a first clock signal and a second input to receive a second clock signal; and a dynamic element matching (DEM) controller coupled to the delay chain circuit to provide a plurality of control signals to the plurality of delay cells, respectively.

In another example, a digital phase-locked loop (DPLL) includes: a digitally controlled oscillator (DCO) configured to generate a clock signal; and a digital-to-time converter (DTC) having first input coupled to an output of the DCO and a second input configured to receive a reference clock signal. The DTC includes: a delay chain circuit having a plurality of delay cells coupled in sequence, the delay chain circuit including a first input to receive the reference clock signal and a second input to receive the clock signal; and a DEM controller coupled to the delay chain circuit to provide a plurality of control signals to the plurality of delay cells, respectively.

In another example, a method of digital-to-time conversion includes: coupling a first clock signal to a first delay path and a second clock signal to a second delay path, each of the first and second delay paths implemented by a delay chain circuit having a plurality of delay cells coupled in sequence; providing a plurality of control signals to the plurality of delay cells to adjust delay of the first delay path with respect to the second delay path.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1A:
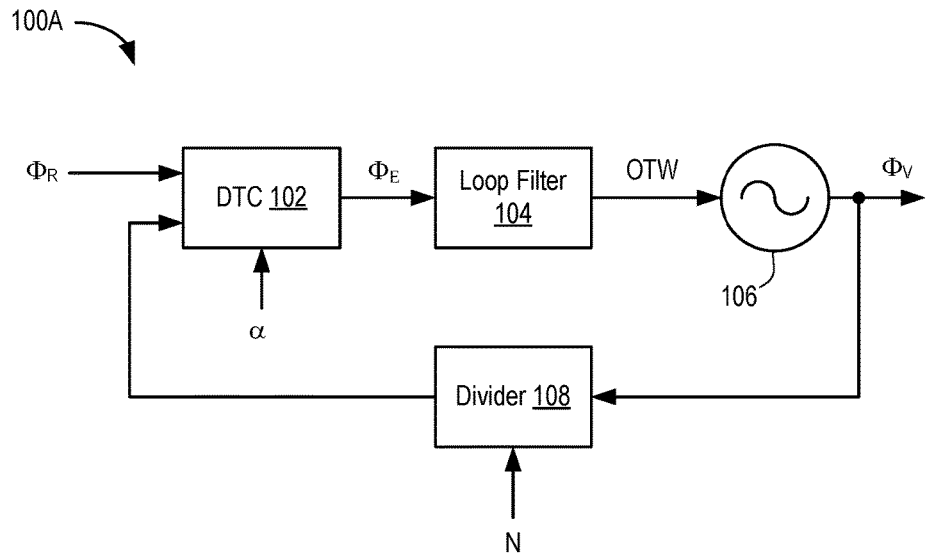
FIG. 1A is a block diagram depicting a digital phase-locked loop (DPLL) according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

Techniques for providing a dual-path digital-to-time converter (DTC) are described. In an example, the DTC includes a delay chain circuit having a plurality of delay cells coupled in sequence. The delay chain circuit includes a first input to receive a reference clock signal and a second input to receive a synthesized high-frequency clock signal. The DTC further includes a dynamic element matching (DEM) controller coupled to the delay chain circuit to provide a plurality of control signals to the plurality of delay cells, respectively. The delay chain provides a fast path and a slow path, which is digitally selected by the control signals. These and other aspects can be understood with reference to the following description and the drawings.

FIG. 1A is a block diagram depicting a digital phase-locked loop (DPLL) 100A according to an example. The DPLL 100A includes a digital-to-time converter (DTC) 102, a loop filter 104, a digitally controlled oscillator (DCO) 106, and a divider 108. A first input of the DTC 102 receives a reference clock signal ($\Phi_R$), a second input of the DTC 102 is coupled to an output of the divider 108, and a third input of the DTC 102 receives a digital signal ($\alpha$). An output of the DTC 102 is coupled to an input of the loop filter 104. An output of the loop filter 104 is coupled to an input of the DCO 106. An output of the DCO 106 is coupled to a first input of the divider 108. A second input of the divider 108 receives a digital signal (N). The digital signals $\alpha$ and N each have a width of multiple bits and the codes provided thereby are referred to as $\alpha$ and N, respectively.

In operation, the DCO 106 generates a clock signal ($\Phi_V$). The divider 108 divides the clock signal $\Phi_V$ by the code N. The DTC 102 is a dual-path DTC that applies slightly different delays to the reference clock signal $\Phi_R$ and the divided clock signal $\Phi_V$ based on the code $\alpha$. The DTC 102 provides a relative delay between the two input signals ($\Phi_R$ and divided $\Phi_V$), rather than an absolute delay to one signal. The relative delay can be positive or negative, as described further below. The DTC 102 avoids code-dependent non-linearity, since the same total delay is implemented independent of the desired output delay, centered at mid-point, exploiting symmetry with respect to the center of the code $\alpha$. The DTC 102 outputs a digital signal $\Phi_E$ representing a phase error. The loop filter 104 filters the digital signal $\Phi_E$ and generates an digital signal OTW. The digital signal OTW controls the oscillation frequency of the DCO 106 and thus the frequency of the clock signal $\Phi_V$.

Figure 1B:
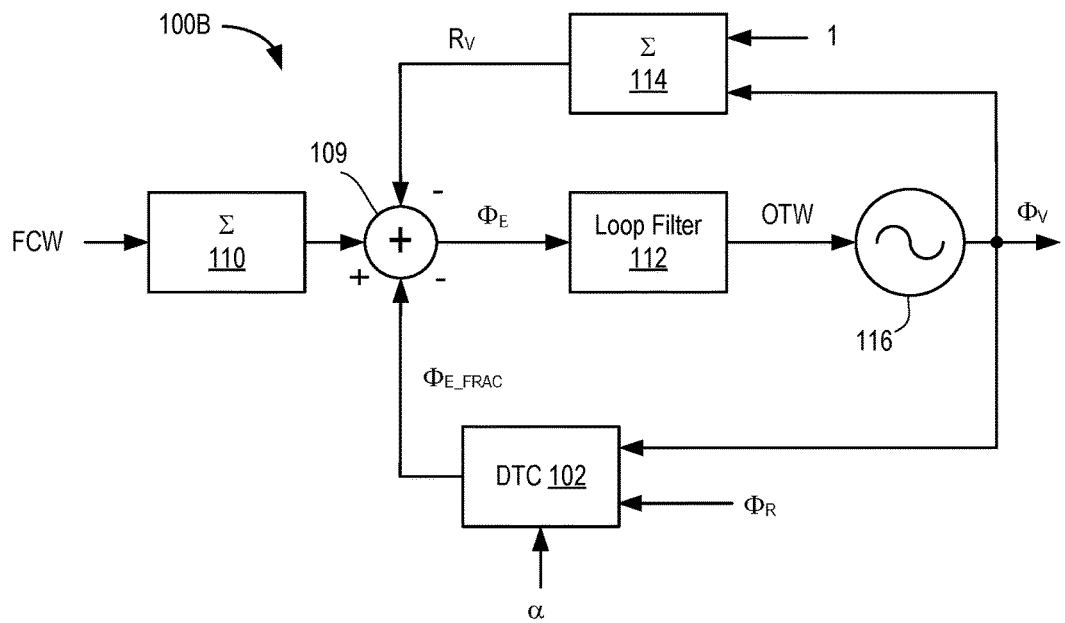
FIG. 1B is a block diagram depicting a DPLL according to another example.

FIG. 1B is block diagram depicting a DPLL 100B according to another example. The DPLL 100B includes an accumulator 110, an adder 109, a loop filter 112, a DCO 116, the DTC 102, and an accumulator 114. An input of the accumulator 110 receives a digital signal FCW. An output of the accumulator 110 is coupled to a first input of the adder 109. A second input of the adder 109 is coupled to an output of the accumulator 114. A third input of the adder 109 is coupled to an output of the DTC 102. An output of the adder 109 is coupled to an input of the loop filter 112. An output of the loop filter 112 is coupled to an input of the DCO 116. An output of the DCO 116 is coupled to a first input of the DTC 102. A second input of the DTC receives the reference clock signal $\Phi_R$. The output of the DCO 116 is also coupled to a clock input of the accumulator 114. Another input of the accumulator 114 receives a digital signal providing a value of "1."

In operation, the DCO 106 generates a clock signal $\Phi_V$. The DTC 102 is a dual-path DTC that operates as described above based on the reference clock signal $\Phi_R$ and the clock signal $\Phi_V$ to generate a digital signal $\Phi_{E\_FRAC}$. The accumulator 110 accumulates a code FCW every clock cycle. The adder 109 computes FCW−$R_V$−$\Phi_{E\_FRAC}$ and outputs a digital signal $\Phi_E$. The loop filter 112 filters the digital signal $\Phi_E$ and generates a digital signal OTW, which controls the oscillation frequency of the DCO 116. The accumulator 114 operates as a counter that increments based on the clock signal $\Phi_V$. The accumulator 114 outputs a digital signal $R_V$, which includes the accumulated value of the accumulator 114. Thus, the DTC 102 can be used in both a divider-based DPLL (e.g., the DPLL 100A) or a counter-based DPLL (e.g., the DPLL 100B).

Figure 2A:
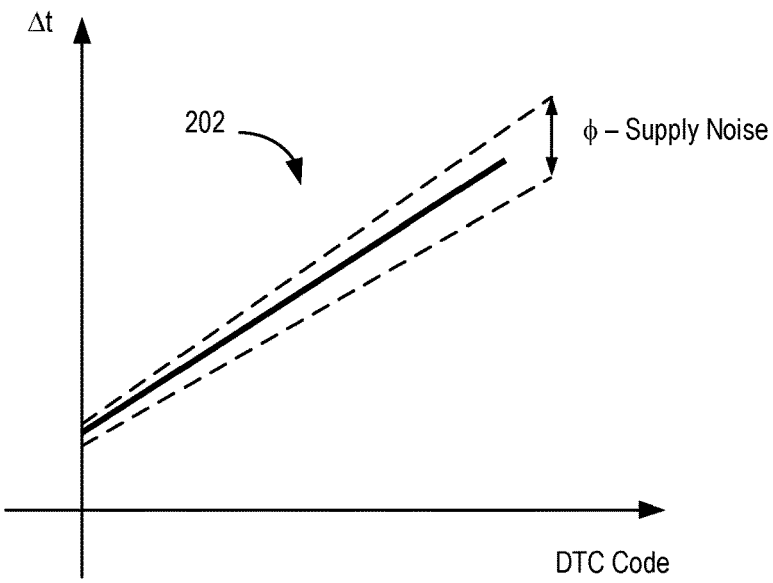
FIG. 2A is a graph illustrating a transfer function of a single-path DTC.

An advantage of the DTC 102 is a transfer function centered at the origin. FIG. 2A is a graph illustrating a transfer function 202 of a single-path DTC, which provides an absolute delay to one of the input clock signals. The x-axis represents DTC code and the y-axis represents the relative delay added between first input and second input, respectively. The transfer function 202 includes a non-zero y-intercept. Further, supply noise can alter the slope of the transfer function in either a positive or negative direction. The single-path DTC is strongly dependent on power supply noise, suffering from power supply jitter injection.

Figure 2B:
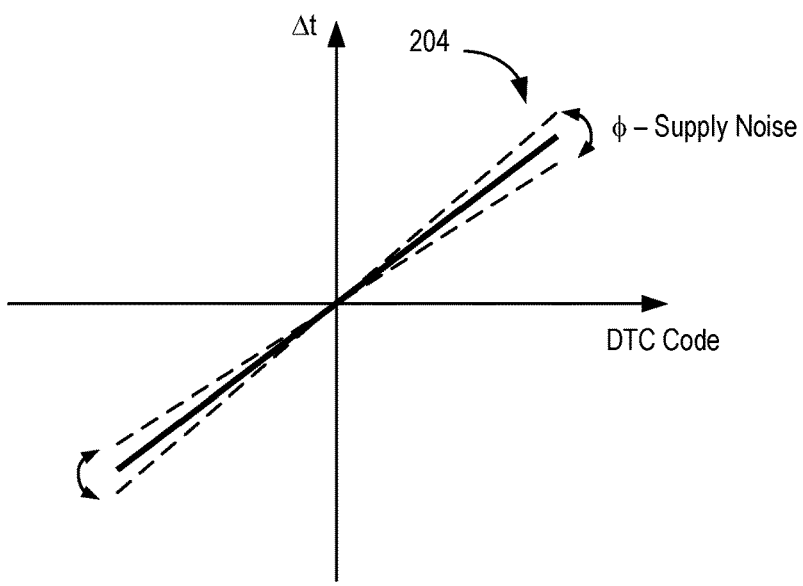
FIG. 2B is a graph illustrating a transfer function of a dual-path DTC.

FIG. 2B is a graph illustrating a transfer function 204 of the dual-path DTC 102. The x-axis represents DTC code and the y-axis represents the converter time at the output. The transfer function 204 passes through the origin. The symmetry of the transfer function 204 about the origin reduces the effect of power supply noise on the output. In the DTC 102, the relative delay, with respect to supply noise, is very small, since the noise affects both input clock signals equally.

Figure 3:
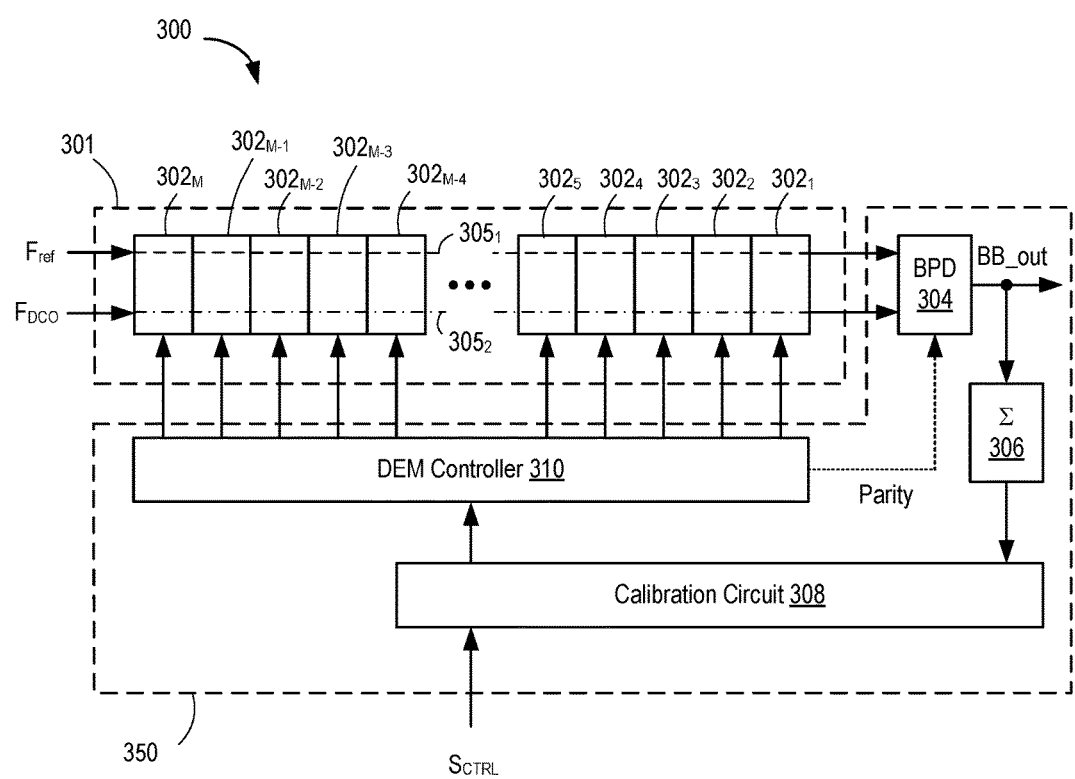
FIG. 3 is a block diagram depicting a DTC according to an example.

FIG. 3 is a block diagram depicting a DTC 300 according to an example. The DTC 300 includes a dual-path delay chain 301 and control circuitry 350. The dual-path delay chain 301 includes delay cells $302_1$ . . . $302_M$ (generally referred to as delay cells 302 or a delay cell 302). Inputs of the delay cell $302_M$ receive a reference clock signal $F_{ref}$ and a DCO output signal $F_{DCO}$. The delay cells $302_M$ . . . $302_1$ successively coupled output-to-input. Outputs of the delay cell $302_1$ can be coupled to inputs of a binary phase detector (BPD) 304. The control circuitry 350 includes a binary phase detector (BPD) 304, an accumulator 306, a calibration circuit 308, and a dynamic element matching (DEM) controller 310. Outputs of the delay cell $302_1$ are coupled to inputs of the BPD 304. An output of the BPD 304 is coupled to an input of the accumulator 306. An output of the accumulator 306 is coupled to a first input of the calibration circuit 308. A second input of the calibration circuit 308 receives a digital signal $S_{CTRL}$. An output of the calibration circuit 308 is coupled to an input of the DEM controller 310. Outputs of the DEM controller 310 are coupled to additional inputs of the delay cells $302_M$ . . . $302_1$, respectively.

The DTC 300 can be used as the DTC 102 in the DPLL 100A or the DPLL 100B, described above. In such case, $F_{ref}$ is the signal $\Phi_R$, $F_{DCO}$ is the divided clock signal $\Phi_V$ or the clock signal $\Phi_V$, $S_{CTRL}$ is the signal $\alpha$, and BB_out is $\Phi_E$ or $\Phi_{E\_FRAC}$. The DTC 300 can also be used in other types of DPLLs, such as digital-to-analog converter (DAC)-based DPLLs.

In operation, the clock signal $F_{ref}$ traverses a first path $305_1$ through the delay cells 302 (referred to as the "reference path") and the clock signal $F_{DCO}$ traverses a second path 3052 through the delay cells 302 (referred to as the "DCO path"). Each of the delay cells 302 has one of two states: (1) in a first state, a fast delay is added to the reference path and a slow delay is added to the DCO path; or (2) in a second state, a slow delay is added to the reference path and a fast delay is added to the DCO path. The state of each delay cell 302 is determined by a logic signal output by the DEM controller 310. The DEM controller 310 can set n of the delay cells 302 in the first state, resulting in M-n of the delay cells 302 being in the second state, where n is between zero and M inclusive. The delay chain 301 reduces mismatches and noise that intrinsically affect the delay cells 302, forcing the input clock signals to experience similar delay modulation towards a more robust relative time difference ($\Delta t$) between them. The modulation of the delay difference, required for fractional-N operation to match the actual input phase difference, in opposite direction, is defined by the number of fast/slow delays that each of the input clock signals go through. The absolute delays applied to each of the input clock signals are not relevant, affecting only the maximum reference frequency. The time difference at the output of the delay chain 301, if a correct DTC gain is provided, will be always within the DTC resolution defined by the difference between the reference and DCO paths (e.g., in the range of tens of femto-seconds).

The output of the delay chain 301 is coupled to the BPD 304, which can operate as a bang-bang phase detector to produce a digital signal BB_out. The accumulator 306 operates to accumulate the output of the BPD 304. The calibration circuit 308 receives both the output of the accumulator 306 and the signal $S_{CTRL}$. The signal $S_{CTRL}$ sets a selected time difference between the input clock signals. For example, the signal $S_{CTRL}$ can be set to drive the time difference between the clock signals towards zero. The calibration circuit 308 monitors the accumulated output of the BPD 304 and adjusts the $S_{CTRL}$ signal to compensate for supply noise and mismatches in the delay chain 301. The DEM controller 310 can be a thermometer decoder or the like that generates the individual control signals for the delay cells 302.

Figure 4:
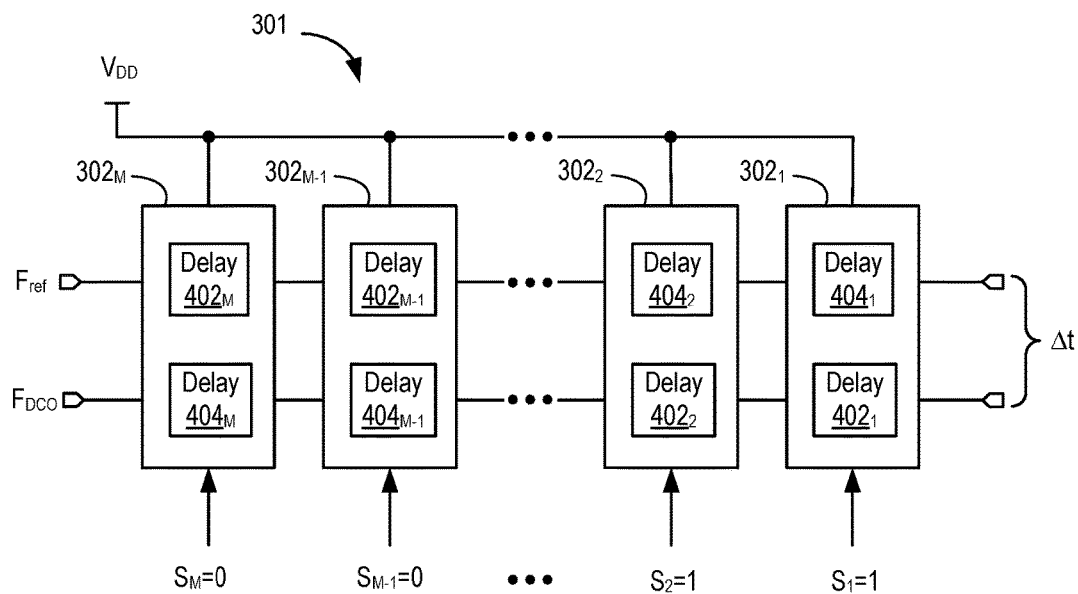
FIG. 4 is a block diagram depicting delay cells of a DTC according to an example.

FIG. 4 is a block diagram depicting the delay cells 302 of the DTC 300 according to an example. The delay cells $302_M \ldots 302_1$ include delay circuits $402_M \ldots 402_1$, respectively (generally referred to as delay circuits 402 or a delay circuit 402). The delay cells $302_M \ldots 302_1$ also include delay circuits $404_M \ldots 404_1$, respectively (generally referred to as delay circuits 404 or a delay circuit 404). Each delay circuit 402 provides a time delay of $\tau_0$, and each delay circuit 404 provides a time delay of $\tau_1$, where to is less than $\tau_1$ (i.e., to is the fast delay and $\tau_1$ is the slow delay). The delay circuits $402_M \ldots 402_1$ also include time delays $\sigma_M \ldots \sigma_1$, respectively, which represent the non-linearity associated therewith. Likewise, the delay circuits $404_M \ldots 404_1$ also include time delays $\varepsilon_M \ldots \varepsilon_1$, respectively, which represent the non-linearity associated therewith. The delay circuits $402_M \ldots 402_1$ also include time delays $\chi_M \ldots \chi_1$, respectively, which represent the uncorrelated noise associated therewith. The delay circuits $404_M \ldots 404_1$ also include time delays $\psi_M \ldots \psi_1$, respectively, which represent the uncorrelated noise associated therewith. As supply voltage $V_{DD}$ is coupled to each of the delay cells 302.

Considering the architecture of FIG. 4, the time delays that both input clock signals will experience based on a control code S (where S is an integer) can be expressed as:

$$T_{REF} = \sum_{i=S+1}^{M} \tau_0 + \sigma_i + \chi_i + \sum_{k=0}^{S} \tau_1 + \varepsilon_k + \psi_k$$

$$T_{DCO} = \sum_{i=0}^{S} \tau_0 + \sigma_i + \chi_i + \sum_{k=S+1}^{M} \tau_1 + \varepsilon_k + \psi_k$$

where $T_{REF}$ is the total time delay provided by the reference path and $T_{DCO}$ is the total delay provided by the DCO path. The time-difference of the output of the delay chain 301 is:

$$\Delta_t = T_{REF} - T_{DCO}$$

$$\Delta_t = (M - 2 \cdot S) \cdot (\tau_0 - \tau_1) +$$
$$\sum_{i=S+1}^{M} (\sigma_i + \chi_i) - (\varepsilon_i + \psi_i) + \sum_{k=0}^{S} (\varepsilon_k + \psi_k) - (\sigma_k + \chi_k)$$

where S is an integer between 0 and M.

Figure 5A:
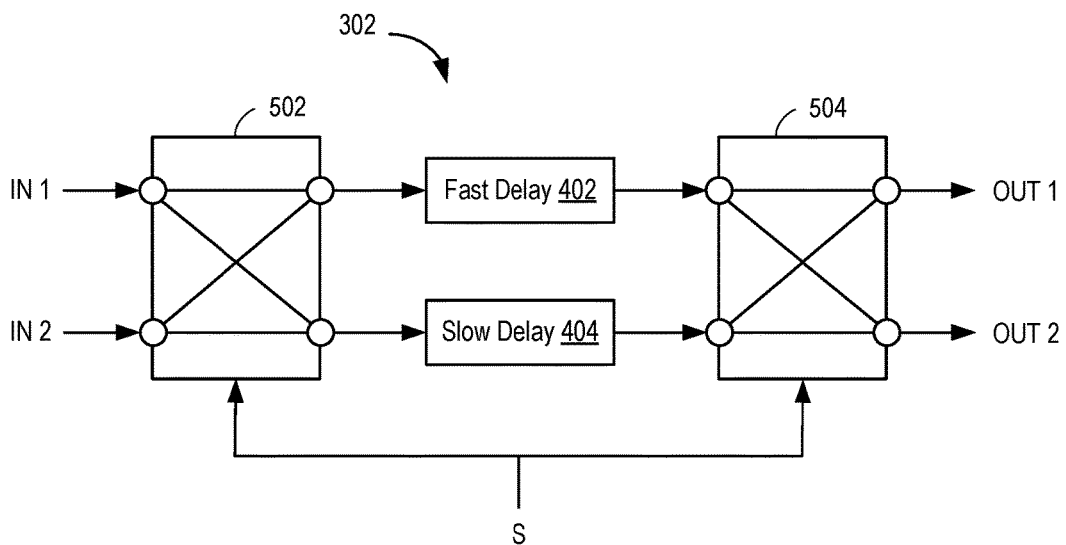
FIGS. 5A-5C depict block diagrams of a delay cell according to different examples.

FIG. 5A is a block diagram depicting a delay cell 302 according to an example. The delay cell 302 includes a multiplexer 502, a fast delay circuit 402, a slow delay circuit 404, and a multiplexer 504. The multiplexer 502 includes inputs IN 1 and IN2 and outputs coupled to the fast delay 402 and the slow delay 404, respectively. The multiplexer 504 includes inputs coupled to outputs of the fast delay 402 and the slow delay 404, respectively. The multiplexer 504 includes outputs OUT 1 and OUT 2. The multiplexers 502 and 504 have inputs that receive a given control signal S. In operation, the multiplexers 502 and 504 direct the input IN 1 to the output OUT 1 and the input IN 2 to the output OUT 2. The multiplexers 502 and 504 direct the input IN 1 through either the fast delay 402 or the slow delay 404, while directing the input IN 2 through either the slow delay 404 or the fast delay 402, respectively, based on the value of S. The multiplexers 502 and 504 can be implemented in different ways. It is desirable, however, that the paths are symmetric as possible, reducing the mismatch between the paths.

Figure 5B:
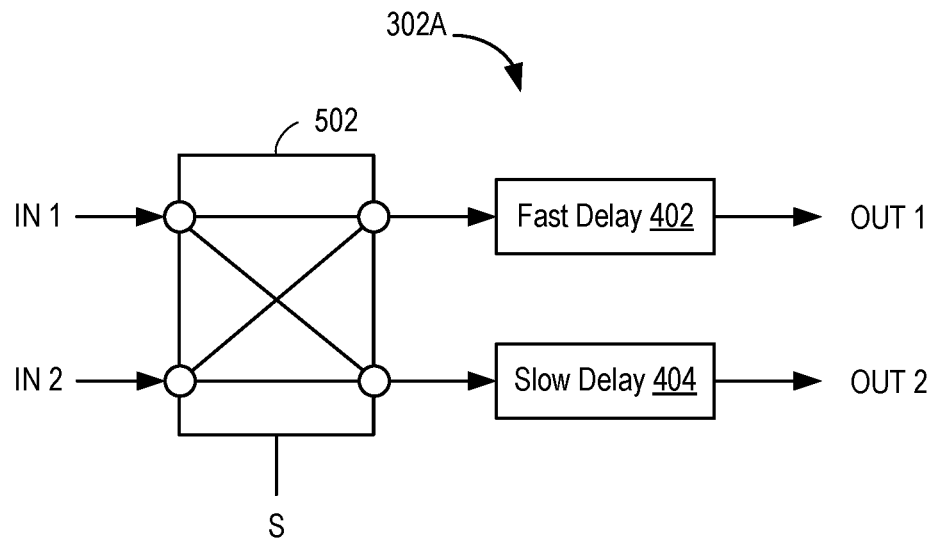
Figure 5C:
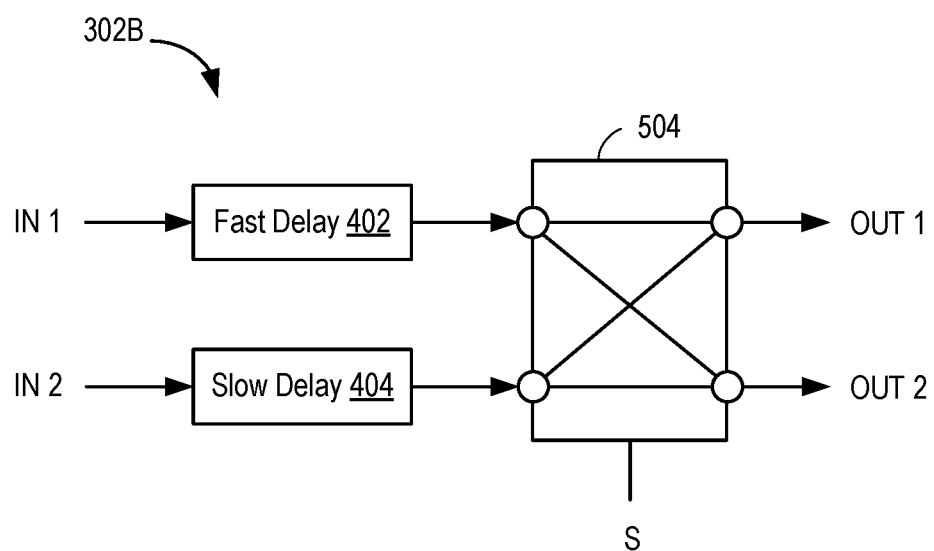

FIG. 5B is a block diagram depicting a delay cell 302A according to another example. The delay cell 302A is an alternative implementation of the delay cell 302 described above in FIG. 5A. In the delay cell 302A, the multiplexer 504 is omitted. FIG. 5C is a block diagram depicting a delay cell 302B according to yet another example. The delay cell 302B is an alternative implementation of the delay cell 302 described above in FIG. 5A. In the delay cell 302B, the multiplexer 502 is omitted. Thus, the delay cell 302 described above can be implemented with both input and output multiplexers (FIG. 5A), only an input multiplexer (FIG. 5B), or only an output multiplexer (FIG. 5C). In cases of only a single multiplexer in each delay cell 302, the BPD 304 can receive a signal from the DEM controller 310 indicating the parity of the number of "flips" performed by the delay cells 302. If there were an odd number of flips (odd parity), then the BPD 304 can invert its output. If there were an even number of flips (even parity), then the BPD 304 does not invert its output.

Figure 6A:
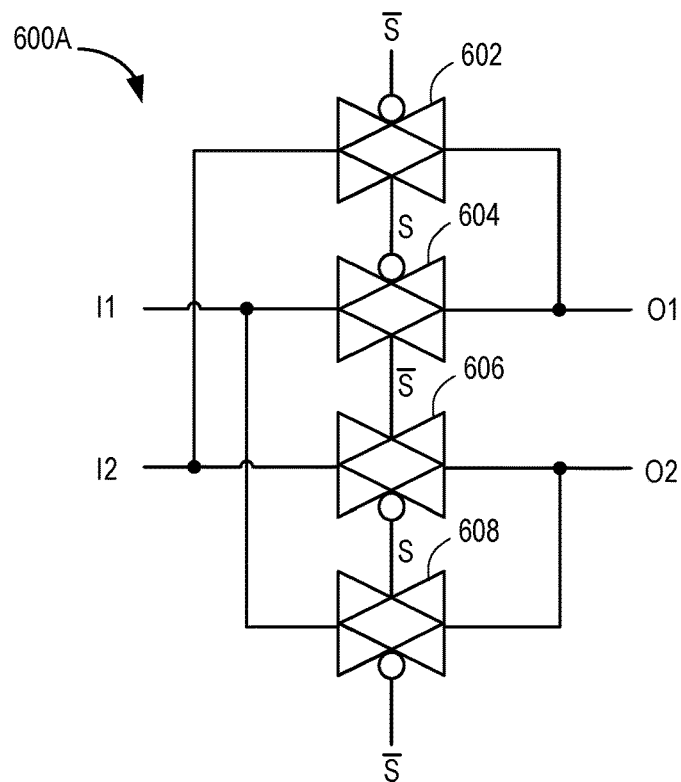
FIGS. 6A-B are schematic diagrams depicting multiplexers according to examples.

FIG. 6A is a schematic diagram depicting a multiplexer 600A according to an example. The multiplexer 600A can implement the multiplexers 502 and 504 of each delay cell 302. The multiplexer 600A includes transmission gates 602, 604, 606, and 608. Inputs of the transmission gates 604 and 608 are coupled to a first input I1, and inputs of the transmission gates 602 and 606 are coupled to a second input I2. Outputs of the transmission gates 602 and 604 are coupled to an output O1, and outputs of the transmission gates 606 and 608 are coupled to an output O2. The control signal S is coupled to true control terminals of the transmission gates 602 and 608, and complement control terminals of the transmission gates 604 and 606. A complement of the control signal S is coupled to complement control terminals of the transmission gates 602 and 608, and true control terminals of the transmission gates 604 and 606. Use of the transmission gates 602 . . . 608 guarantees equal delay and load to both reference and DCO paths. The inner transmission gates 604 and 606 are active for S=0, and the output transmission gates 602 and 608 are active for S=1.

Figure 7A:
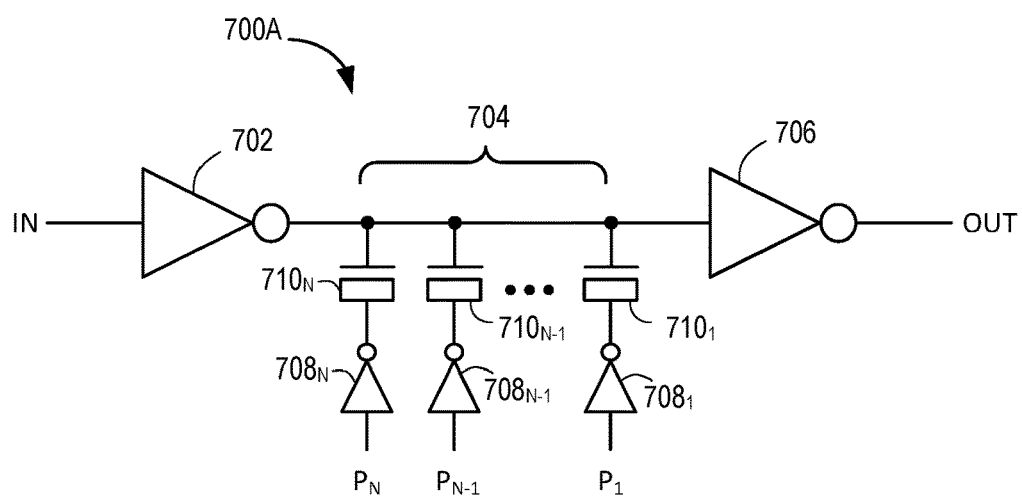
FIG. 7A-B are schematic diagrams depicting delay circuits according to examples.
Figure 6B:
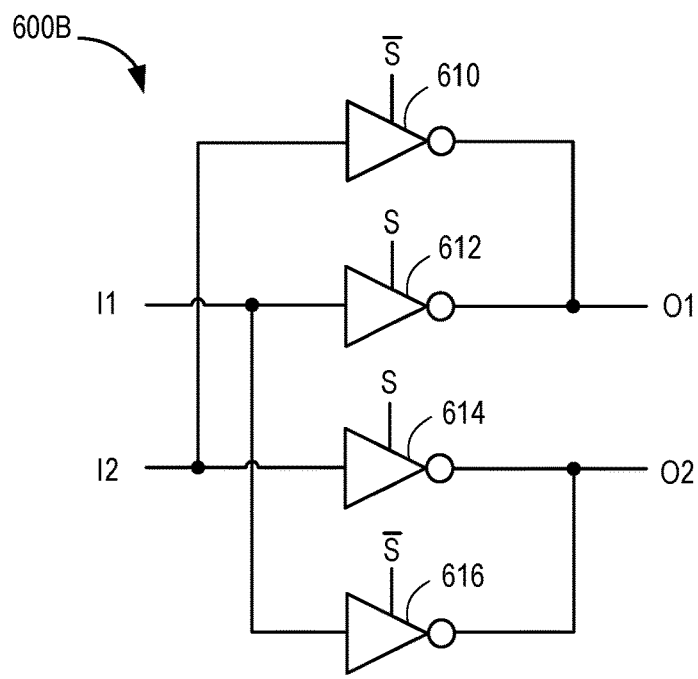
Figure 7B:
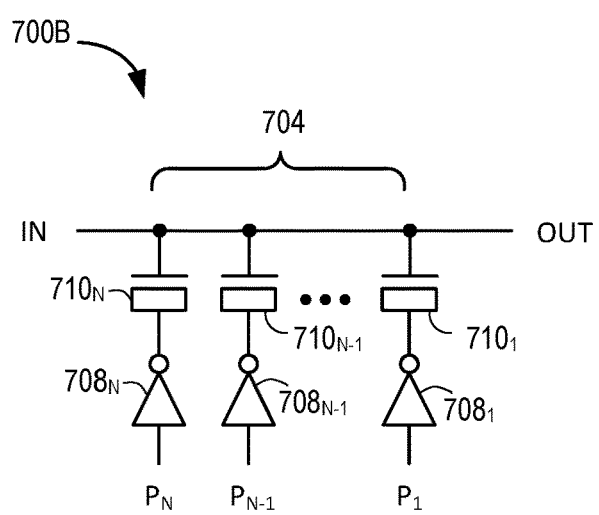

FIG. 7A is a schematic diagram depicting a delay circuit 700A according to an example. The delay circuit 700A can implement the fast delay circuit 402 or the slow delay circuit 404. The delay circuit 700A includes an inverter 702, a switched capacitor array 704, and an inverter 706. An input of the inverter 702 is coupled to an input IN. An output of the inverter 702 is coupled to the switched capacitor array 704. An input of the inverter 706 is coupled to the switched capacitor array 704. An output of the inverter 706 is coupled to an output OUT. The switched capacitor array 704 is coupled between the inverters 702 and 706. In operation, the inverter 702 provides signal recovery, as well as buffering and isolation from the transmission gates of the input multiplexer. The inverter 706 provides buffering and isolation of the transmission gates of the output multiplexer. The switched capacitor array 704 includes a plurality of metal oxide semiconductor (MOS) capacitors $710_1$ . . . $710_N$ (where N is an integer greater than one) and a plurality of inverters $708_1$ . . . $708_N$. Outputs of the inverters 708 are coupled to first terminals of the MOS capacitors 710. Second terminals of the MOS capacitors 710 are coupled to the node between the inverters 702 and 706. Inputs of the inverters 708 receive control signals $P_N$ . . . $P_1$ that determine the overall capacitance of the switched capacitor array 704. The signals $P_N$ . . . $P_1$ can be generated by the DEM controller 310. The delay is given by Gm/C, where Gm is the transconductance of the inverter 702 and C is the capacitance of switched capacitor array 704. To implement the fast delay, the control signals $P_N$ . . . $P_1$ can control all MOS capacitors OFF to provide minimum capacitance. To implement the slow delay, the control signals $P_N$ . . . $P_1$ can control one or more of the MOS capacitors to be ON to provide a particular capacitance that can be determined based on PVT conditions.

FIGS. 6A-7A show one example of a multiplexer 600A and delay circuit 700A that can be used in the delay chain 301 of the DTC 300. In another example, the transmission gates 602 . . . 608 can be replaced with three-state inverters. FIG. 6B shows a multiplexer 600B having three-state inverters 610 . . . 616 that replace the transmission gates 602 . . . 608. FIG. 7B shows a delay circuit 700B, where the inverters 702 and 706 in the delay cell are omitted. In still another example, the inverters 702 and 706 can be disposed on the opposite sides of the respective input and output multiplexers. That is, the inverter 702 can be disposed at the input side of the input multiplexer, and the inverter 706 can be disposed at the output side of the output multiplexer.

Figure 8:
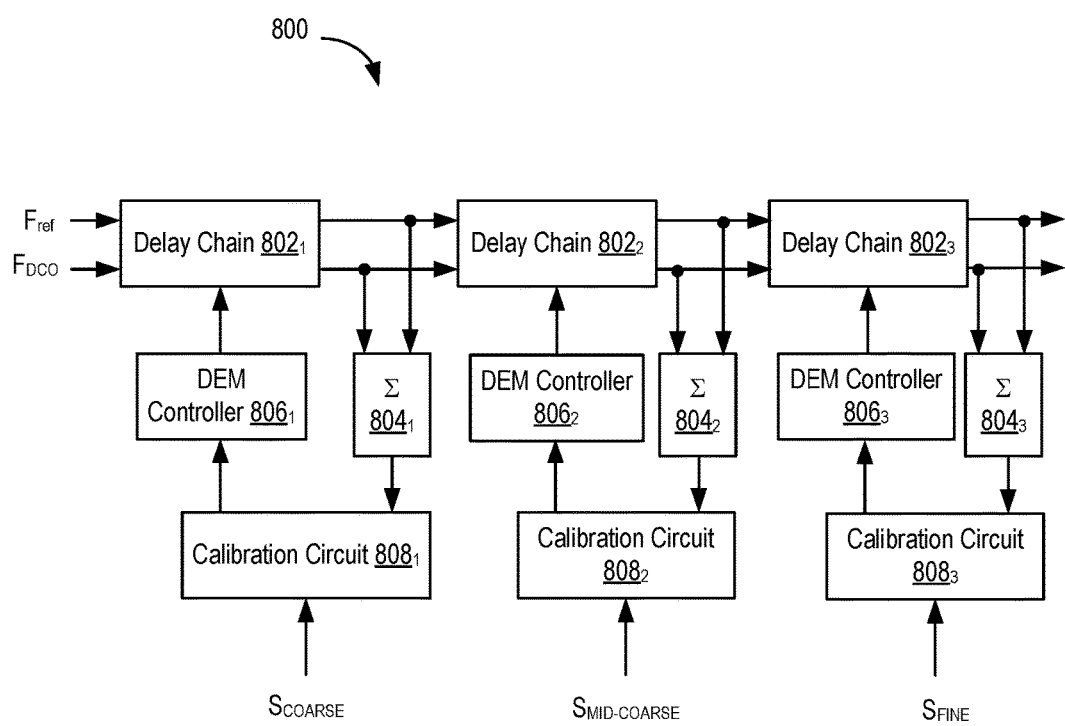
FIG. 8 is a block diagram depicting a DTC according to another example.

FIG. 8 is a block diagram depicting a DTC 800 according to another example. In the present example, the delay chain of the DTC 800 is divided into separate delay chains $802_1$, $802_2$, and $802_3$. Likewise, the DEM controller is divided into separate DEM controllers $806_1$, $806_2$, and $806_3$. Likewise, the calibration circuit is divided into separate calibration circuits $808_1$, $808_2$, and $808_3$. The output of the delay chain $802_1$ is coupled to the input of the delay chain $802_2$ and to an input of an accumulator $804_1$. An output of the accumulator $804_1$ is coupled to an input of the calibration circuit $808_1$. An output of the calibration circuit $808_1$ is coupled to an input of the DEM controller $806_1$. The output of the delay chain $802_2$ is coupled to the input of the delay chain $802_3$ and to an input of the accumulator $804_2$. An output of the accumulator $804_2$ is coupled to an input of the calibration circuit $808_2$. An output of the calibration circuit $808_2$ is coupled to an input of the DEM controller $806_2$. The output of the delay chain $802_3$ is coupled to an input of an accumulator $804_3$. An output of the accumulator $804_3$ is coupled to an input of the calibration circuit $808_3$. An output of the calibration circuit $808_3$ is coupled to an input of the DEM controller $806_3$. Inputs of the calibration circuits $808_1$, $808_2$, and $808_3$ receive coarse, mid-coarse, and fine control signals.

In the present example, the dual-path DTC is segmented into unit-weighted blocks with different resolutions. Due to the fact that the dual-path DTC operates by centering the signal edges towards alignment, the input range of each segment is +/−0.5 least significant bit (LSB) of the previous segment, reducing exponentially the number of elements. A large dynamic range and ultra-fin resolution can be obtained with a fraction of the number of units.

Figure 9:
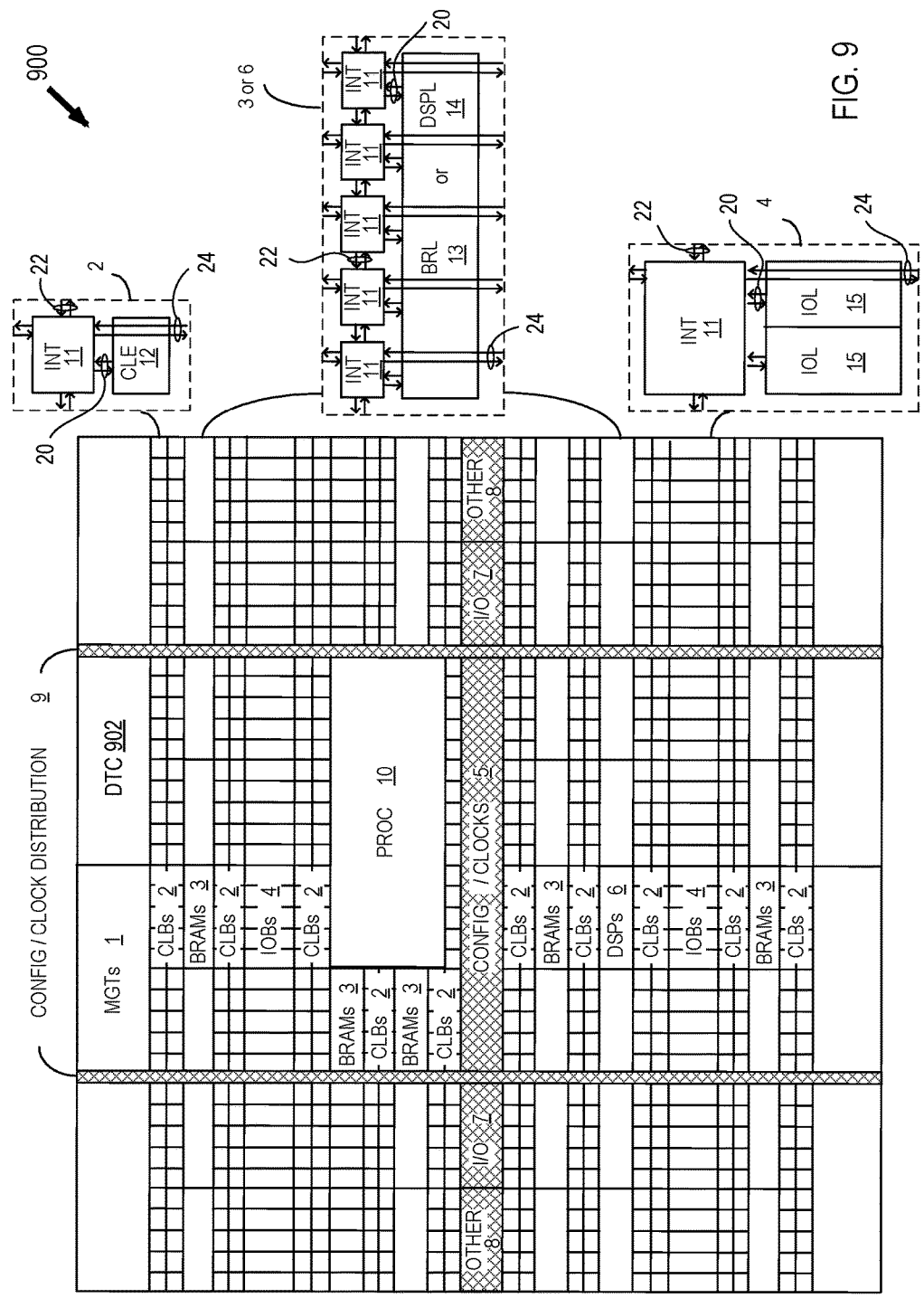
FIG. 9 is a block diagram depicting a field programmable gate array (FPGA) in which a dual-path DTC described herein can be used.

The dual-path DTC described in the examples above can be implemented within an integrated circuit, such as a field programmable gate array (FPGA) or like type programmable circuit. FIG. 9 illustrates an architecture of FPGA 900 that includes a large number of different programmable tiles including multi-gigabit transceivers ("MGTs") 1, configurable logic blocks ("CLBs") 2, random access memory blocks ("BRAMs") 3, input/output blocks ("IOBs") 4, configuration and clocking logic ("CONFIG/CLOCKS") 5, digital signal processing blocks ("DSPs") 6, specialized input/output blocks ("I/O") 7 (e.g., configuration ports and clock ports), and other programmable logic 8 such as digital clock managers, analog-to-digital converters, system monitoring logic, and so forth. Some FPGAs also include dedicated processor blocks ("PROC") 10. FPGA 900 can include one or more instances of a dual-path DTC 902, which can be constructed according to any example above.

In some FPGAs, each programmable tile can include at least one programmable interconnect element ("INT") 11 having connections to input and output terminals 20 of a programmable logic element within the same tile, as shown by examples included at the top of FIG. 9. Each programmable interconnect element 11 can also include connections to interconnect segments 22 of adjacent programmable interconnect element(s) in the same tile or other tile(s). Each programmable interconnect element 11 can also include connections to interconnect segments 24 of general routing resources between logic blocks (not shown). The general routing resources can include routing channels between logic blocks (not shown) comprising tracks of interconnect segments (e.g., interconnect segments 24) and switch blocks (not shown) for connecting interconnect segments. The interconnect segments of the general routing resources (e.g., interconnect segments 24) can span one or more logic blocks. The programmable interconnect elements 11 taken together with the general routing resources implement a programmable interconnect structure ("programmable interconnect") for the illustrated FPGA.

In an example implementation, a CLB 2 can include a configurable logic element ("CLE") 12 that can be programmed to implement user logic plus a single programmable interconnect element ("INT") 11. A BRAM 3 can include a BRAM logic element ("BRL") 13 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 6 can include a DSP logic element ("DSPL") 14 in addition to an appropriate number of programmable interconnect elements. An IOB 4 can include, for example, two instances of an input/output logic element ("IOL") 15 in addition to one instance of the programmable interconnect element 11. As will be clear to those of skill in the art, the actual I/O pads connected, for example, to the I/O logic element 15 typically are not confined to the area of the input/output logic element 15.

In the pictured example, a horizontal area near the center of the die (shown in FIG. 9) is used for configuration, clock, and other control logic. Vertical columns 9 extending from this horizontal area or column are used to distribute the clocks and configuration signals across the breadth of the FPGA.

Some FPGAs utilizing the architecture illustrated in FIG. 9 include additional logic blocks that disrupt the regular columnar structure making up a large part of the FPGA. The additional logic blocks can be programmable blocks and/or dedicated logic. For example, processor block 10 spans several columns of CLBs and BRAMs. The processor block 10 can various components ranging from a single microprocessor to a complete programmable processing system of microprocessor(s), memory controllers, peripherals, and the like.

Note that FIG. 9 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 9 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing is directed to specific examples, other and further examples may be devised without departing from the basic scope thereof, and the scope thereof is determined by the claims that follow.

What is claimed is:

1. A digital-to-time converter (DTC), comprising:
   a delay chain circuit having a plurality of delay cells coupled in sequence, the delay chain circuit including a first input to receive a first clock signal and a second input to receive a second clock signal, wherein each of the plurality of delay cells includes a first multiplexer and first and second delay circuits coupled to the first multiplexer; and
   a dynamic element matching (DEM) controller coupled to the delay chain circuit to provide a plurality of control signals to the plurality of delay cells, respectively.

2. The DTC of claim 1, further comprising:
   a phase detector coupled to an output of the delay chain circuit;
   an accumulator coupled to an output of the phase detector; and
   a calibration circuit coupled to an output of the accumulator and an input of the DEM controller, the calibration circuit including an input to receive a control signal.

3. The DTC of claim 1, wherein each of the plurality of delay cells includes a first delay circuit and a second delay circuit, wherein the delay chain circuit includes a first path through the plurality of delay cells and a second path through the plurality of delay cells, and wherein each of the plurality of delay cells couples the first delay circuit thereof to the first path and the second delay circuit thereof to the second path, or the second delay circuit thereof to the first path and the first delay circuit thereof to the second path, based on a respective one of the plurality of control signals.

4. The DTC of claim 1, wherein each of the plurality of delay cells includes a second multiplexer and first and second delay circuits coupled between the first and second multiplexers.

5. The DTC of claim 4, wherein the first multiplexer and the second multiplexer of each of the plurality of delay cells includes a plurality of transmission gates.

6. The DTC of claim 4, wherein the first and second delay circuits of each of the plurality of delay cells each include a first inverter, a second inverter, and a switched capacitor array coupled between the first and second inverters.

7. The DTC of claim 4, wherein the first multiplexer and the second multiplexer of each of the plurality of delay cells includes a plurality of three-state inverters, and wherein the first and second delay circuits of each of the plurality of delay cells each include a switched capacitor array coupled between the first and second multiplexers.

8. The DTC of claim 1, wherein the delay chain circuit includes a plurality of separate delay chains, each of the plurality of separate delay chains include a portion of the plurality of delay cells, and wherein the DEM controller includes a plurality of separate DEM controllers respectively coupled to the plurality of separate delay chains.

9. A digital phase-locked loop (DPLL), comprising:
   a digitally controlled oscillator (DCO) configured to generate a clock signal; and
   a digital-to-time converter (DTC) having first input coupled to an output of the DCO and a second input configured to receive a reference clock signal, the DTC including:
      a delay chain circuit having a plurality of delay cells coupled in sequence, the delay chain circuit including a first input to receive the reference clock signal and a second input to receive the clock signal, wherein each of the plurality of delay cells includes a first multiplexer and first and second delay circuits coupled to the first multiplexer; and
      a DEM controller coupled to the delay chain circuit to provide a plurality of control signals to the plurality of delay cells, respectively.

10. The DPLL of claim 9, wherein the DTC further comprises:
    a phase detector coupled to an output of the delay chain circuit;
    an accumulator coupled to an output of the phase detector; and
    a calibration circuit coupled to an output of the accumulator and an input of the DEM controller, the calibration circuit including an input to receive a control signal.

11. The DPLL of claim 9, wherein each of the plurality of delay cells includes a first delay circuit and a second delay circuit, wherein the delay chain circuit includes a first path through the plurality of delay cells and a second path through the plurality of delay cells, and wherein each of the plurality of delay cells couples the first delay circuit thereof to the first path and the second delay circuit thereof to the second path, or the second delay circuit thereof to the first path and the first delay circuit thereof to the second path, based on a respective one of the plurality of control signals.

12. The DPLL of claim 9, wherein each of the plurality of delay cells includes a second multiplexer and first and second delay circuits coupled between the first and second multiplexers.

13. The DPLL of claim 12, wherein the first multiplexer and the second multiplexer of each of the plurality of delay cells includes a plurality of transmission gates.

14. The DPLL of claim 13, wherein the first and second delay circuits of each of the plurality of delay cells each include a first inverter, a second inverter, and a switched capacitor array coupled between the first and second inverters.

15. The DPLL of claim 12, wherein the first multiplexer and the second multiplexer of each of the plurality of delay cells includes a plurality of three-state inverters, and wherein the first and second delay circuits of each of the plurality of delay cells each include a switched capacitor array coupled between the first and second multiplexers.

16. The DPLL of claim 9, wherein the delay chain circuit includes a plurality of separate delay chains, each of the plurality of separate delay chains include a portion of the plurality of delay cells, and wherein the DEM controller includes a plurality of separate DEM controllers respectively coupled to the plurality of separate delay chains.

17. A method of digital-to-time conversion, comprising:
coupling a first clock signal to a first delay path and a second clock signal to a second delay path, each of the first and second delay paths implemented by a delay chain circuit having a plurality of delay cells coupled in sequence, wherein each of the plurality of delay cells includes a multiplexer and first and second delay circuits coupled to the multiplexer;
providing a plurality of control signals to the plurality of delay cells to adjust delay of the first delay path with respect to the second delay path.

18. The method of claim 17, wherein each of the plurality of delay cells includes a first delay circuit and a second delay circuit, and wherein each of the plurality of delay cells couples the first delay circuit thereof to the first delay path and the second delay circuit thereof to the second delay path, or the second delay circuit thereof to the first delay path and the first delay circuit thereof to the second delay path, based on a respective one of the plurality of control signals.

* * * * *